United States Patent
Qu et al.

(10) Patent No.: US 9,761,706 B2
(45) Date of Patent: Sep. 12, 2017

(54) SIC TRENCH TRANSISTOR AND METHOD FOR ITS MANUFACTURE

(71) Applicant: Robert Bosch GmbH, Stuttgart (DE)

(72) Inventors: Ning Qu, Reutlingen (DE); Thomas Jacke, Tuebingen (DE); Michael Grieb, Renningen-Malmsheim (DE); Martin Rambach, Pliezhausen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/110,180

(22) PCT Filed: Nov. 21, 2014

(86) PCT No.: PCT/EP2014/075277
§ 371 (c)(1),
(2) Date: Jul. 7, 2016

(87) PCT Pub. No.: WO2015/106863
PCT Pub. Date: Jul. 23, 2015

(65) Prior Publication Data
US 2016/0329424 A1     Nov. 10, 2016

(30) Foreign Application Priority Data
Jan. 15, 2014 (DE) .................. 10 2014 200 613

(51) Int. Cl.
*H01L 29/66* (2006.01)
*H01L 29/78* (2006.01)
(Continued)

(52) U.S. Cl.
CPC ...... *H01L 29/7813* (2013.01); *H01L 29/0619* (2013.01); *H01L 29/0634* (2013.01);
(Continued)

(58) Field of Classification Search
CPC  H01L 29/4236; H01L 29/66734; H01L 29/66
See application file for complete search history.

(56) References Cited

U.S. PATENT DOCUMENTS

| | | |
|---|---|---|
| 2004/0194798 A1 | 10/2004 | Suzuki |
| 2005/0161732 A1 | 7/2005 | Mizukami et al. |
| 2012/0319136 A1* | 12/2012 | Noborio .............. H01L 29/1095 257/77 |

FOREIGN PATENT DOCUMENTS

| | | |
|---|---|---|
| DE | 10 2009 017358 | 10/2009 |
| EP | 2 626 905 | 8/2013 |

(Continued)

OTHER PUBLICATIONS

International Search Report dated Feb. 5, 2015, of the corresponding International Application PCT/EP2014/075277, filed on Nov. 21, 2014.

*Primary Examiner* — Jae Lee
(74) *Attorney, Agent, or Firm* — Norton Rose Fulbright US LLP; Gerard Messina

(57) ABSTRACT

An SiC trench transistor having a first terminal and an epitaxial layer positioned vertically between a gate trench and a second terminal; a compensation layer extending horizontally being provided in the epitaxial layer, the compensation layer having an effective doping of a type opposite to the doping of the epitaxial layer. A method for manufacturing an SiC trench transistor is also provided, an epitaxial layer being provided on a second terminal of the SiC trench transistor; a compensation layer extending horizontally being implanted in the epitaxial layer, the compensation layer having an effective doping of a type opposite to the doping of the epitaxial layer; and a first terminal and a gate trench being provided above the compensation layer.

6 Claims, 3 Drawing Sheets

(51) Int. Cl.
*H01L 29/739* (2006.01)
*H01L 29/06* (2006.01)
*H01L 29/08* (2006.01)
*H01L 29/16* (2006.01)

(52) U.S. Cl.
CPC ...... *H01L 29/0847* (2013.01); *H01L 29/1608* (2013.01); *H01L 29/66068* (2013.01); *H01L 29/7397* (2013.01)

(56) References Cited

FOREIGN PATENT DOCUMENTS

| | | |
|---|---|---|
| JP | 2008177335 A | 7/2008 |
| JP | 2013155670 A | 8/2013 |
| WO | WO 99/26296 | 5/1999 |

\* cited by examiner

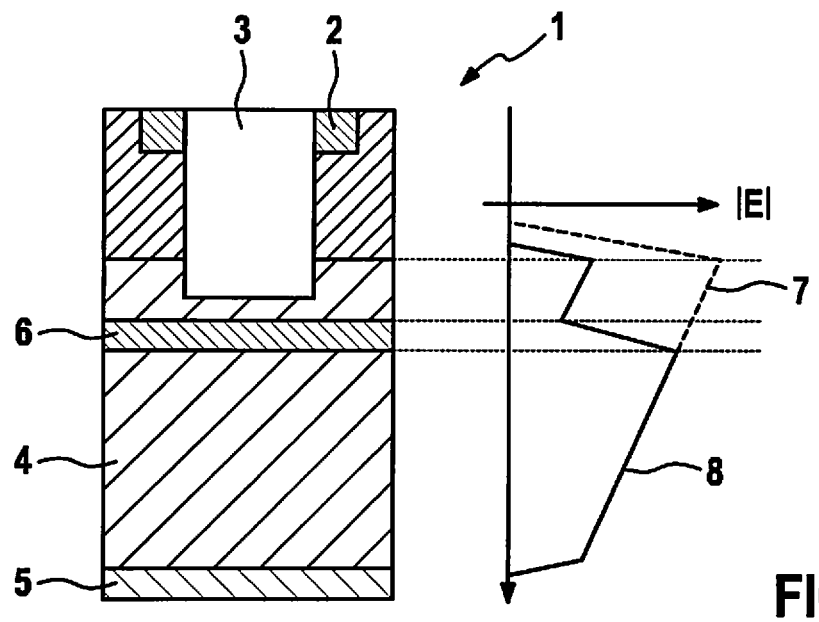
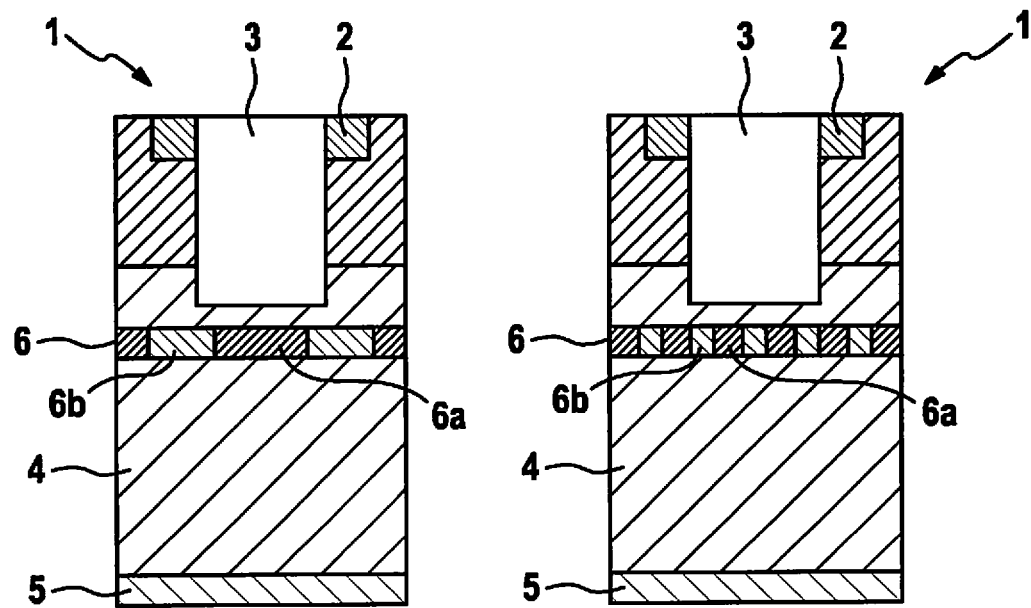

SIC TRENCH TRANSISTOR AND METHOD FOR ITS MANUFACTURE

FIELD

The present invention relates to an SiC trench transistor and a method for manufacturing it.

BACKGROUND INFORMATION

In several applications, silicon (Si) based power semiconductors are, in the meantime, in the range of their physical limits. Composite semiconductor materials, such as silicon carbide (SiC), provide a remedy.

In SiC-based components, the gate oxide generally has a slight band offset in the conduction band from comparable silicon components, which means that degradation due to tunnel currents already occurs at lower gate field strengths. For SiC transistors, in particular, MOSFET's (metal oxide semiconductor field effect transistor), a sensible field strength in the gate oxide is 3 MV/cm. Adherence to this limiting value is critical, in particular, in cutoff operation and makes design measures necessary, in particular, in the case of trench devices.

The present state of science or the art is the double-trench SiC device design of Rohm from the year 2011, which, with 0.79 mOhm*cm$^2$, attains a top value for the specific forward resistance Ron in the voltage class of 600 V.

The field strength at the gate oxide may be reduced, for example, by introducing a double trench having deep p-implantation. In this context, the p-type areas that are situated deeper constitute a JFET (barrier layer field effect transistor), which shields the actual trench MOSFET structure.

The field strengths at the gate oxide may also be reduced to approximately 4 MV/cm by introducing p-doped regions (p-bubbles) below the gate oxide (J. Tan et al, High-Voltage Accumulation-Layer, UMOSFET's in 4H—SiC, IEEE ELECTRON DEVICE LETTERS, VOL. 19, NO. 12, DECEMBER, 1998).

Alternatively, the two measures mentioned above (double trench, p-bubbles) may be combined (Source 4: Shinsuke Harada et al., "Determination of optimum structure of 4H—SiC Trench MOSFET," Proceedings of the 2012 24th International Symposium on Power Semiconductor Devices and IC's, pp. 253ff).

The conventional measures for reducing the gate oxide field strength are sometimes only effective to a limited extent or have considerable disadvantages, such as higher required surface area, electrical resistance, and/or process complexity. In particular, the double trench structure requires considerable space, since the requisite trench structure is situated next to the trench gate. Consequently, the specific sheet resistance Ron*A increases and limits the technological progress due to higher integration density. Besides the increased surface requirement, the resistance in parts of the current path is also markedly increased due to the JFET effect of the double trench.

SUMMARY

The present invention provides an SiC trench transistor having a first terminal and an epitaxial layer positioned vertically between a gate trench and a second terminal; a compensation layer extending horizontally being provided in the epitaxial layer, the compensation layer having an effective doping of a type opposite to the doping of the epitaxial layer. The compensation layer permits a reduction in the electrical field strength of the gate without increased surface requirement. This additional layer produces a step in the vertical field profile, the lower level being situated between the body and the compensation layer (region close to the gate), and the high field level being situated below the compensation layer (epitaxial layer or drift region). Thus, in particular, in the case of silicon carbide (SiC) based components, the lower band offset in the conduction band of the gate oxide may be compensated for.

In accordance with the present invention, a semiconductor structure is provided, which reduces the gate field strength and is inserted vertically into the SiC trench structure. Due to the vertical integration, the trench structures may be packed considerably more densely, and the specific sheet resistance between drain and source, Rdson*A, correspondingly decreases. Secondly, the field strength in the gate region may be set by appropriately selecting the dopings and spacings. By decoupling the field region near the gate from the epitaxial layer, that is, from the drift region, higher levels of n-type doping may be used in the drift region near the channel without significant disadvantages for the voltage capacity of the drift zone. Here, the advantage is the reduction of ohmic losses in the region near the channel (current spreading).

The arithmetic mean of the doping of the compensation layer may correspond to the doping of the opposite type. This permits various forms of doping of the compensation layer, since the mean must simply correspond to a particular doping value. Thus, irregular dopings are possible.

In one particular, specific embodiment, the transistor is an SiC trench MOSFET, the first terminal is a source terminal, the second terminal is a drain structure, and the epitaxial layer is a drift zone. Particularly in the case of MOSFET's, the setting or adjustment of the gate field strength according to the present invention is important.

The compensation layer may include passages having a doping type of the drift zone. These passages permit current flow for the MOSFET, so that the method of functioning or operability of the MOSFET is not limited. The passages may have round or angular contours and may be positioned so as to have regular or irregular spacings or patterns.

It is advantageously provided that the compensation layer include an alternating sequence of p-doped and n-doped regions in a surface direction of the compensation layer. This variant is simple to produce and allows effective current flow and simple calculation and production of the doping of the compensation layer, in particular, calculation and implementation of the arithmetic mean of the doping.

As an alternative, it is advantageously provided that the compensation layer have an alternating pattern of p-doped and n-doped regions in two surface directions of the compensation layer. In comparison with the one-dimensional arrangement described above, this two-dimensional arrangement of the regions permits even finer adjustment of doping and current flow and, consequently, of the gate field strength.

It is also possible for the transistor to be an SiC trench IGBT (insulated gate bipolar transistor), the first terminal to be a cathode terminal, the second terminal to be an anode terminal, and the epitaxial layer to be a base region. In this case, the compensation layer permits a reduction of the field strength in the gate oxide, which opens up new areas of application for IGBT's.

The compensation layer may have a low, uniform doping of a type opposite to the doping type of the base region. This doping may be produced in a simple manner.

A distance from the compensation layer to the gate channel is preferably, at a maximum, 25% of the drift zone thickness. It has been shown that this distance range permits an optimum field strength in the gate oxide.

The method of the present invention for manufacturing an SiC trench transistor includes, in general, the following steps:
- providing an epitaxial layer on a second terminal of the SiC trench transistor;
- implanting a compensation layer in the epitaxial layer, the compensation layer extending horizontally and having an effective doping of a type opposite to the doping of the epitaxial layer; and
- providing a first terminal and a gate trench above the compensation layer.

The introduction of the compensation layer in accordance with the present invention advantageously allows the electric field strength distribution in the gate trench and/or in the epitaxial layer to be controlled, so that the transistor may be set exactly to its use.

Advantageous further refinements of the present invention are described herein.

BRIEF DESCRIPTION OF THE DRAWINGS

Exemplary embodiments of the present invention are explained in greater detail with reference to the figures and the following description.

FIG. 1 shows a schematic sectional view of an SiC trench MOSFET having a compensation layer and corresponding electric field strength distribution.

FIG. 2 shows an exemplary embodiment of the compensation layer in one surface direction.

FIG. 3 shows a further exemplary embodiment of the compensation layer in one surface direction.

DETAILED DESCRIPTION OF EXAMPLE EMBODIMENTS

Figure 4:
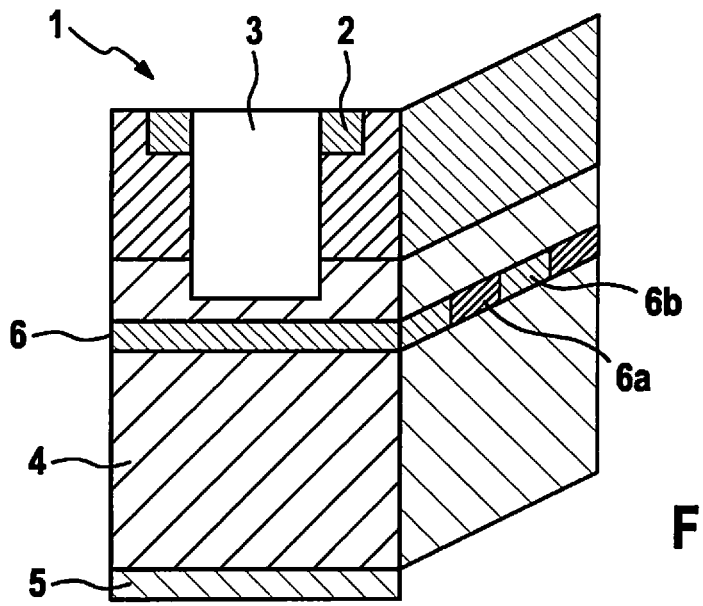
FIG. 4 shows a further exemplary embodiment of the compensation layer in a different surface direction.

FIG. 1 shows a cross-section of an SiC trench transistor 1 having a source terminal 2 and a gate trench 3. An epitaxial layer in the form of a drift zone 4 is situated below source terminal 2 and gate trench 3. A drain terminal or a drain structure 5 is situated below drift zone 4.

A compensation layer 6, which extends horizontally, is provided in the drift zone 4 situated between gate 3 and drain structure 5. Here, the statements made in regard to directions, such as below or horizontally, relate to the pictorial representation in the figures. If transistor 1 is oriented in a manner different from that in FIG. 1, then these relative terms must be appropriately redefined. On the other hand, the directional references may also be defined in relation to gate trench 3, or more precisely, in relation to its major dimension, which runs, in this case, from top to bottom. Accordingly, compensation layer 6 runs perpendicularly to gate trench 3.

In the example of SiC trench transistor 1 represented in FIG. 1, drift zone 4 is n-doped and compensation layer 6 is effectively p-doped, that is, with the type or charge type opposite to drift zone 4. Of course, the dopings may also be selected so as to be reversed. The effective doping may be defined, for example, as the arithmetic mean of the doping in compensation layer 6. The spatial extension of compensation layer 6 in a plane, for example, the x- and y-directions, is then normally limited to the cell or the region of transistor 1.

The magnitude of electric field strength E versus the vertical extension of transistor 1 is plotted in the graph to the right of and next to transistor 1. A first curve 7 represented as a dashed line shows the field strength characteristic for a conventional SiC trench transistor not having a compensation layer. In this case, the maximum of the electric field strength is situated in the region of the p-n junction between the source region and drift zone 4, which results in a high gate field strength. On the other hand, second curve 8 shows the field strength characteristic of the illustrated SiC trench transistor 1 according to the present invention. As can be seen, compensation layer 6 produces a step in the vertical field profile, the lower level of the field strength distribution being situated between gate 3 and compensation layer 6, while the higher field level being situated below compensation layer 6, or to be more precise, in the region of the p-n junction between compensation layer 6 and drift zone 4.

The field strength profile of transistor 1 may be adjusted or set individually to the purpose of application, using the level of effective doping of compensation layer 6, the vertical positioning of compensation layer 6, that is, in particular, the distance between compensation layer 6 and gate trench 3, and/or the thickness of compensation layer 6 in the vertical direction.

A first implementation of compensation layer 6 is represented in FIG. 2. In this case, the compensation layer is made up of an alternating sequence of n-doped regions 6a and p-doped regions 6b. In this context, n-doped regions 6a form passages for the current of transistor 1. The spacing of the individual regions, that is, their width or length, are greater than the space charge regions and are small (ideally less than $\frac{1}{10}$) in comparison with the drift zone length, that is, the distance between gate 3 and drain structure 5. This results in a typical structure size of 0.1 to 5 μm. Doped regions 6a and 6b extend in a strip-shaped manner in the direction of strip-shaped gate trench 3, thus, in this case, into the plane of the sheet of paper.

For the electrical conductivity of compensation layer 6 in the case of the conducting state of transistor 1, as high a doping level as possible should be strived for under the boundary condition that the effective doping or average doping or, expressed in a different way, the volume-weighted difference between the negative and positive dopant concentrations, is maintained in accordance with the desired vertical field strength characteristic, including the manufacturing tolerances.

The p-n junctions of compensation layer 6 may be developed largely freely, that is, optimized with regard to conducting state characteristics and/or manufacturing options. The periodicity of compensation layer 6, that is, the alternating sequence of n-doped regions 6a and p-doped regions 6b, should be selected to be less than or in the order of magnitude of the drift zone (typically 1 to 10 μm).

An SiC trench transistor 1 including a compensation layer 6, which has a greater periodicity, that is, where layer 6 has more p-n junctions per cell in comparison with FIG. 2, is shown in FIG. 3. In the strip-shaped design of the gate shown here, compensation layer 6 also has a strip-shaped design parallel to the orientation of the gate, thus, parallel to a surface direction of compensation layer 6. In this case, n-regions 6a of compensation layer 6 are advantageously placed in position under the channel region.

A further example of an SiC trench transistor 1 having a compensation layer 6 is represented in FIG. 4. In this case, as well, compensation layer 6 is made up of an alternating sequence of p-doped regions 6b and n-doped regions 6a along a surface direction of compensation layer 6. In contrast with FIGS. 2 and 3, in this case, doped regions 6a and 6b run transversely or perpendicularly to the extension of strip-shaped gate 3. Doped regions 6a and 6b may also be positioned at a different angle.

Figure 5:
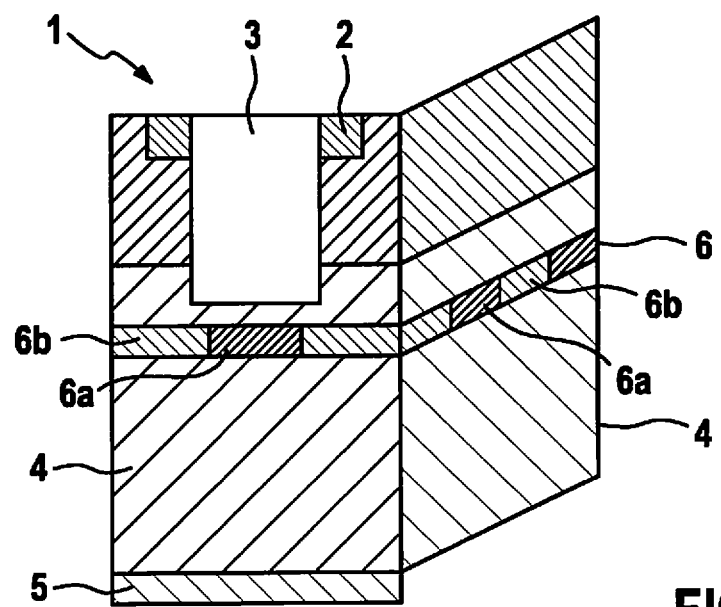
FIG. 5 shows a further exemplary embodiment of the compensation layer in two surface directions.

An SiC trench transistor having a compensation layer 6, in which an alternating pattern of p-doped regions 6b and n-doped regions 6a is provided in two surface directions of compensation layer 6, is represented in FIG. 5. Here, the pattern is a two-dimensional periodic grid, which is suited, in particular, to two-dimensional MOS designs, such as hexagonal cell structures. A chessboard design is also possible. In this case, as well, n-regions 6a of compensation layer 6 are also placed in position below the channel region, at least with regard to the longitudinal extension of gate trench 3.

Figure 6:
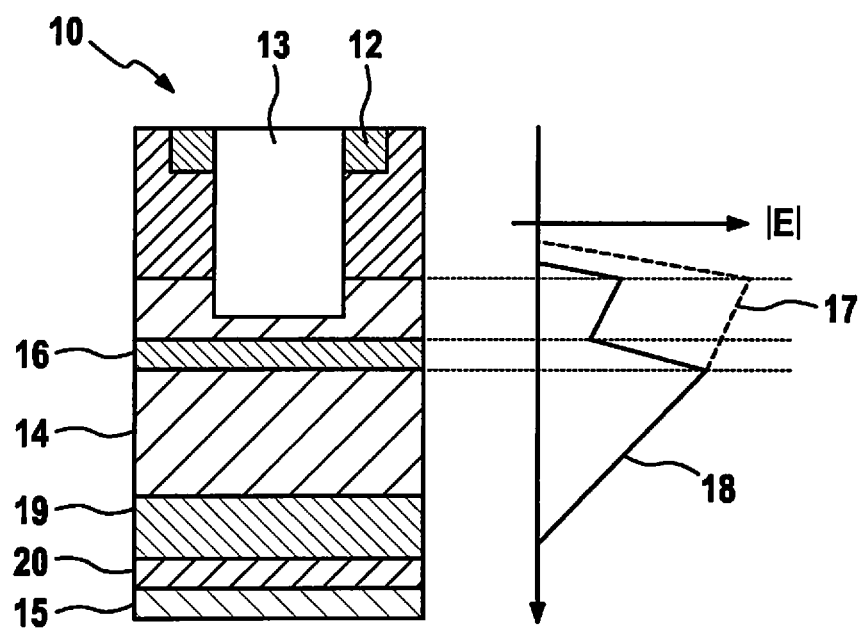
FIG. 6 shows a schematic sectional view of an SiC trench IGBT having a compensation layer and corresponding electric field strength distribution.

An SiC trench IGBT 10 having a cathode terminal 12 and a gate trench 13 is represented in FIG. 6. A base region 14 in the form of an epitaxial layer is situated below gate trench 13 and cathode terminal 12. An anode terminal 15 is provided, in turn, below base region 14. A compensation layer 16 extending horizontally is provided in base region 14, in order to reduce the field strength in the gate oxide. As before, compensation layer 16 has an effective doping of a type opposite to the doping of base region 14. In this case, base region 14 is n-doped, while compensation layer 16 is p-doped. Since no unipolar forward-state current is needed in an IGBT, compensation layer 16 may be formed as a low-level-doped, uniform layer. The field strength characteristic shown on the right in FIG. 6 corresponds to the characteristic represented in FIG. 1. Curve 17 shows the characteristic of the field strength for a known IGBT not having a compensation layer 16. In this context, the magnitude of the field strength is highest in the region of the gate oxide. Curve 18 shows the field strength characteristic, which is optimized by compensation layer 16 and has markedly lower field strength in the region of the gate oxide.

Below base region 14, transistor 10 includes an optional, highly n-doped layer 19 for limiting or stopping the electric field. A p-doped layer 20 is situated between layer 19 and anode 15. Compensation layer 16 also changes the characteristic of the field strength in this region. Thus, the field strength characteristic extends further through compensation layer 16, in the direction of anode 15.

The technological implementation or production of the above-mentioned components in the form of SiC trench transistors 1, 10 is accomplished in two epitaxial steps; after the first epitaxy, in which the epitaxial layer (drift zone 4, base region 14) is deposited on a second terminal (drain 5, anode 15), the compensation layer 6 or 16 being implanted or implanted in a patterned manner. In a second epitaxial step or other step, the gate region (body, source and/or cathode) is subsequently produced.

What is claimed is:

1. An SiC trench transistor having a first terminal and an epitaxial layer positioned vertically between a gate trench and a second terminal, wherein a compensation layer extending horizontally is provided in the epitaxial layer, the compensation layer having an effective doping of a type opposite to a doping of the epitaxial layer;
    wherein the transistor is an SiC trench MOSFET, the first terminal is a source terminal, the second terminal is a drain structure, and the epitaxial layer is a drift zone; and
    wherein a distance from the compensation layer to the gate trench is, at a maximum, 25% of a thickness of the drift zone.

2. A method for manufacturing an SiC trench transistor, comprising:
    providing an epitaxial layer on a second terminal of the SiC trench transistor;
    implanting a compensation layer in the epitaxial layer, the compensation layer extending horizontally and having an effective doping of a type opposite to a doping of the epitaxial layer; and
    providing a first terminal and a gate trench above the compensation layer;
    wherein the transistor is an SiC trench MOSFET, the first terminal is a source terminal, the second terminal is a drain structure, and the epitaxial layer is a drift zone; and
    wherein a distance from the compensation layer to the gate trench is, at a maximum, 25% of a thickness of the drift zone.

3. The SiC trench transistor as recited in claim 1, wherein an arithmetic mean of the doping of the compensation layer corresponds to the doping of the opposite type.

4. The SiC trench transistor as recited in claim 1, wherein the compensation layer includes passages that have doping of the type of the drift zone.

5. The SiC trench transistor as recited in claim 1, wherein the compensation layer includes an alternating sequence of p-doped and n-doped regions in a surface direction of the compensation layer.

6. The SiC trench transistor as recited in claim 1, wherein the compensation layer includes an alternating pattern of p-doped and n-doped regions in two surface directions of the compensation layer.

\* \* \* \* \*